United States Patent [19]

Davis et al.

[11] E Re. 31,391

[45] Reissued Sep. 20, 1983

[54] VOLTAGE AND CURRENT REGULATOR WITH AUTOMATIC SWITCHOVER

[75] Inventors: William F. Davis, Tempe, Ariz.; Ronald W. Russell, Sunnyvale, Calif.; Thomas M. Frederiksen; Ernest L. Long, both of San Jose, Calif.

[73] Assignee: Motorola, Inc., Del.

[21] Appl. No.: 649,005

[22] Filed: Jan. 14, 1976

Related U.S. Patent Documents

Reissue of:

[64] Patent No.: 3,786,344
Issued: Jan. 15, 1974
Appl. No.: 185,939
Filed: Oct. 4, 1971

[51] Int. Cl.[3] ..... F02D 5/00; H01F 7/18

[52] U.S. Cl. ..... 361/154; 123/490; 323/267; 323/271; 323/285; 330/254

[58] Field of Search ..... 123/32 EA, 490; 323/4, 323/20, 267, 268, 271, 272, 280, 285; 361/152, 154; 330/254, 255

[56] References Cited

U.S. PATENT DOCUMENTS

| | | | |
|---|---|---|---|
| 3,205,412 | 9/1965 | Winston | 361/154 |
| 3,303,411 | 2/1967 | Gately | 323/4 |
| 3,416,088 | 12/1968 | Baldwin | 330/254 X |
| 3,452,289 | 6/1969 | Ryan | 330/254 |
| 3,527,997 | 9/1970 | Nercessian | 323/9 |
| 3,554,169 | 1/1971 | Wahl et al. | 123/32 EA |
| 3,582,734 | 6/1971 | Bryden | 361/152 |
| 3,602,804 | 8/1971 | Randall | 323/20 |
| 3,624,489 | 11/1971 | Betton | 323/9 |
| 3,636,931 | 1/1972 | Suda et al. | 123/32 EA |
| 3,641,422 | 2/1972 | Farnsworth et al. | 323/20 X |
| 3,646,915 | 3/1972 | Rachel | 123/32 EA |
| 3,697,883 | 10/1972 | Wilcox | 330/254 |
| 3,706,937 | 12/1972 | Hanna | 330/254 |
| 3,786,314 | 1/1974 | Misch | 361/154 |

FOREIGN PATENT DOCUMENTS

| | | | |
|---|---|---|---|
| 1409515 | 7/1965 | France | 361/152 |
| 1092863 | 11/1967 | United Kingdom | 323/20 |

*Primary Examiner*—A. D. Pellinen
*Attorney, Agent, or Firm*—Vincent B. Ingrassia

[57] ABSTRACT

A system for energizing an inductive load includes a voltage regulator for providing a constant voltage across the load until the current builds up to a particular value, and a current regulator which then takes over to provide a constant holding current at a lower value. The voltage regulator may include a closed loop for holding the voltage across the inductive load constant or may respond to a regulated voltage value to control a power stage for providing a constant voltage. The voltage across a sensing resistor in the power stage controls the crossover from the voltage regulation mode, to the current regulation mode and the current regulator automatically resets the reference to control the power stage to provide a constant current of a lower value through the load. The system can be used to supply current to coils of injector valves in a fuel injection system, and may include two power stages for supplying current to two banks of coils. The regulator system is switched from one power stage to the other during successive 180° rotary positions of the engine for both stages.

21 Claims, 3 Drawing Figures

5A
1.6A
A
B
C

VOLTAGE AND CURRENT REGULATOR WITH AUTOMATIC SWITCHOVER

Matter enclosed in heavy brackets [ ] appears in the original patent but forms no part of this reissue specification; matter printed in italics indicates the additions made by reissue.

BACKGROUND OF THE INVENTION

Electronic fuel injection systems have injector valves with inductive coils for opening and closing the valves in timed relation. This timed relation requires rapid current buildup in the coils to accurately time the opening of the injector valves. Reduced current can then be applied to the coils to keep the valves open for a specified length of time, with the valves being closed at a precise time by cutting off the current in the coils. The magnetic characteristics of inductive coils, whether used in fuel injection systems for driving a magnetic valve, or in a mechanical relay, or even in certain magnetic memories, are such that once the magnetic field has been established by the buildup of current, maintenance of the field requires much less current, with the current needed varying in the range from one-half to one-tenth the amount needed to originally energize the field. This is because the energy necessary to pull in a valve or armature is greater than that required to hold the same operated.

Separate voltage and current regulators have been utilized in the past to energize coils, but no successful system has been designed which can automatically crossover from voltage regulation to precise current regulation, as is desired. In order to conserve space, it is desirable to have a regulator system of the aforementioned characteristics which can be incorporated into an integrated circuit chip.

SUMMARY OF THE INVENTION

It is an object of the present invention to provide a system for precisely controlling current buildup in an inductive load.

It is another object of the invention to provide an energizing system for an inductive load which provides voltage controlled current buildup therein, and maintains current regulation after a predetermined current is reached.

It is a further object of the invention to provide a system for energizing an inductive load which reduces the current in the energized load to permit precise cutoff of the magnetic field of the inductive load.

It is still another object of the invention to provide a voltage and current regulator for an inductive load, with automatic crossover from voltage regulation to current regulation.

It is yet a further object to provide a precise voltage and current regulator with automatic crossover from voltage regulation to current regulation for fuel injector coils, which regulator is adapted to be incorporated in an integrated circuit chip.

A power stage which supplies a controlled current to an inductive load formed by a bank of fuel injector coils is controlled by a voltage regulator working together with a current regulator. In one embodiment the voltage regulator includes a differential amplifier operating in a closed loop to control the output of the power stage to the injector valve coils, to limit the voltage of the power stage output to a given value. A voltage regulator of other known design can be used.

The power stage includes a current sensing resistor through which the current supplied to the bank of injector coils flows. A control voltage developed across the current sensing resistor is coupled to a current regulator which includes a differential amplifier having a first input for receiving the control voltage and a second input to which a reference voltage is applied. When the current applied to the injector coils reaches a designated value, the current regulator is rendered operative and a feedback circuit acts to change the reference voltage applied to the differential amplifier and causes the same to act to provide reduced current through the coils. This is accomplished by providing reduced drive to the power stage to reduce the output current, and in turn reduce the voltage across the current sensing resistor. With a reduction in the output current, the differential amplifier becomes balanced and the current output to the injector coils is maintained at a predetermined value, lower than that necessary to originally energize the bank of injector coils.

DETAILED DESCRIPTION

Figures 1, 2:
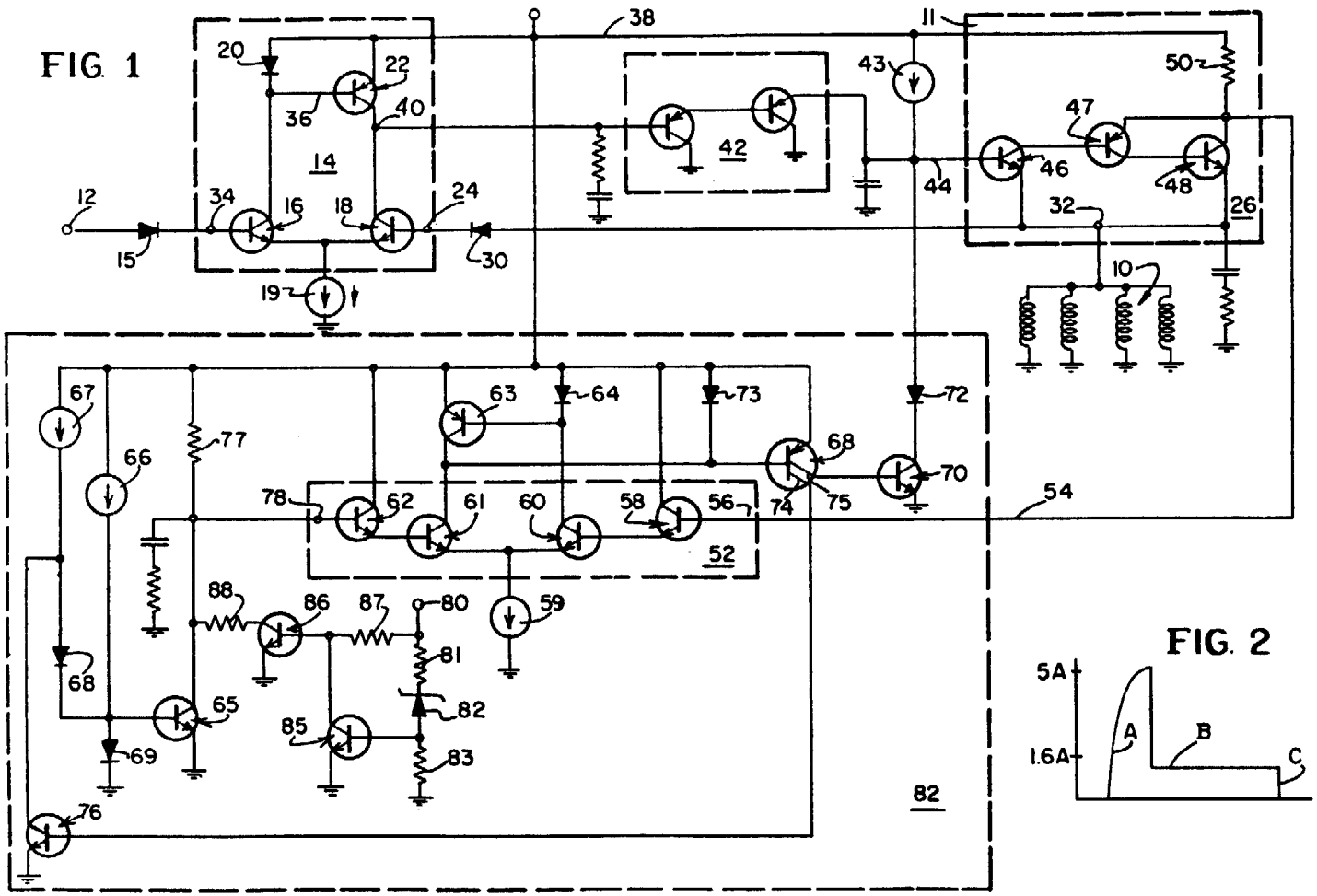
FIG. 1 is a schematic diagram of one embodiment of the voltage and current regulator circuit with automatic crossover, of the present invention.
FIG. 2 is a curve illustrating the current buildup and holding current in the coils.

The voltage and current regulator shown in the schematic diagram of FIG. 1 precisely controls the current buildup and turn off in the bank of injector coils 10. Four coils are shown which may simultaneously provide fuel to four cylinders of an engine, and which may be used with a second set of four coils for a V-8 engine. To provide current buildup in the coils, current is applied thereto from a voltage supply 38, which may be energized by a battery. The voltage supplY may have a nominal value of 12 volts, and may vary from 11 to 16 volts depending on the condition of charge of the battery. Under starting conditions when heavy current is drawn from the battery, the voltage may drop below 11 volts and can reach a value of the order of 6 volts.

Current is applied from the supply 38 through a power amplifier 26 which includes transistors 46, 47 and 48 to terminal 32 connected to the coils 10. The three transistors 46, 47 and 48 can be considered equivalent to a single large NPN transistor which has a very high beta. The current supplied by the amplifier 26 to the coils 10 flows through resistor 50 which is used to measure the output current, as will be explained. The current flowing through resistor 50 is illustrated in FIG. 2.

The system of FIG. 1 includes a voltage regulator comprising a differential amplifier 14 including transistors 16 and 18. A reference voltage is applied to terminal 12, which is connected through diode 15 to the base of transistor 16. The voltage across the coils 10 is applied from terminal 32 through diode 30 to the base of transistor 18. The emitters of transistors 16 and 18 are connected through current source 19 to ground potential. The collector of transistor 16 is connected through diode 20 to the supply voltage line 38, and the collector of transistor 18 is connected through the emitter-collector path of transistor 22 to the line 38.

Transistor 22 and diode 20 form a turn around circuit for controlling the output of the differential amplifier derived at point 40 connected to the collector of transistor 18. The diode 20 and transistor 22 are constructed so that when transistors 16 and 18 conduct equal amounts, there is no current flow through point 40. However, when transistor 16 conducts the full current of the source 19 and transistor 18 is nonconducting, current will flow from the supply through transistor 22 to the point 40. On the other hand when transistor 18 conducts the full current from the source 19 and transistor 16 conducts no current, so that there is no current through diode 20, transistor 22 is cut off and the current through transistor 18 is supplied from point 40. Accordingly, full current can flow in opposite directions through point 40 as the conductivity shifts from transistor 16 to transistor 18, and vice versa.

The voltage at the terminal 32 during the current buildup in the injector coils of bank 10 is controlled by the voltage regulator loop comprising the differential amplifier 14, the power stage 26, the feedback path through diode 30 to terminal 24 connected to the base of transistor 18 of the differential amplifier 14, and the emitter-follower circuit 42 connecting output 40 of the differential amplifier to the input 44 of the power stage 26. This acts to maintain the voltage at the output terminal 32 at the reference voltage applied from terminal 12 through diode 15 to the terminal 34 of the differential amplifier, during the current buildup time which is indicated as A in FIG. 2.

When the potential at the output terminal 32 is greater than the reference potential, transistor 18 conducts more than transistor 16, being turned on more as the voltage at terminal 32 is higher than the reference voltage at terminal 12. Less current then flows through the transistor 16 to reduce the current through diode 20 to reduce the conductivity of transistor 22. As a consequence, the current through transistor 18 is derived, at least in part, from point 40, which causes the emitter-followers 42 to in effect "steal" current from the current source 43 so that less current is applied to the input terminal 44 of power stage 26, which is connected to the base of transistor 46. This current "stealing" from the base of transistor 46 continues, with the current being shunted through emitter-followers 42 to the ground potential, until the potential at terminal 32 is reduced to that of the reference terminal 12. Transistor 46 decreases in conduction during this period of time, with transistor 47 likewise decreasing its conduction, and the output transistor 48 also decreasing its conduction. This decrease in current through the coils causes the potential at terminal 32 to decrease.

In the event that the potential at output terminal 32 is less than the reference potential at terminal 12, transistor 16 conducts more than transistor 18, drawing more current through diode 20. This causes transistor 22 to conduct heavily and it can supply more current than transistor 18 conducts. This acts to turn off the emitter-followers 42 so that the full current from source 43 is supplied to the base of transistor 46. This causes the power stage 26 to operate to increase the potential at output terminal 32.

The circuit of the invention crosses over to current control when the current flowing through the coils 10, and which passes through resistor 50, has increased to a predetermined value, such as 5 amps. This produces 0.5 volts across the 0.1 ohm resistor 50, and activates the current regulator 82. The current regulator includes a differential amplifier 52 which has one input 56 connected through lead 54 to the resistor 50, and a second input 78 to which a reference potential is applied from the voltage supply line 38 through resistor 77. The differential amplifier is formed by first and second Darlington circuits having the common emitters connected to ground through current source 59. The first Darlington circuit is formed by transistor 58 and 60, and the second circuit is formed by transistors 61 and 62. While the current is building up in the coils 10, the voltage across resistor 50 is less than the voltage across resistor 77, and as both resistors are connected to the supply line 38, potential applied at input 56 is greater than the potential applied at input 78, so that transistors 58 and 60 conduct heavily.

The voltage across resistor 77, which produces the reference potential, is controlled by the current through this resistor, which in turn is controlled by the conductivity of transistor 65. The base of transistor 65 is connected to a circuit including current sources 66 and 67 connected to the supply voltage line 38, and diodes 68 and 69. Source 67 is connected in series with diode 68, and the currents through the sources 66 and 67 flow through diode 69. Diode 69 is constructed with areas matched to the transistor 65 so that the same amount of current which flows through diode 69 will flow through transistor 65 to thereby control the current through resistor 77. The voltage drop across resistor 77 controls the reference voltage applied to the base of transistor 62.

When the current through resistor 50 increases to drop the voltage applied to the base of transistor 58, this transistor, as well as the transistor 60 will conduct less. This causes transistors 61 and 62 to increase in conductivity. Transistor 60 has its collector connected through diode 64 to the voltage of supply line 38, and transistor 61 has its collector connected through transistor 63 to the line 38. Transistor 63 and diode 64 form a turn around circuit as described above in connection with differential amplifier 14. The output of the differential amplifier 52, at the collector of transistor 61, is connected to the base of transistor 68, which is a lateral PNP transistor having first and second collector electrodes. When transistor 61 increases its conduction, the current through transistor 63 will be reduced so that current will be drawn through diode 73 connected to the base of transistor 68. This causes transistor 68 to conduct.

Collector 74 of transistor 68 is coupled to transistor 76, which is connected to shunt the current of the current source 67 to ground. This reduces the current through diode 69 and the current through transistor 65 to reduce the current through resistor 77. This acts to reduce the voltage drop across resistor 77 and causes the reference potential input 78 of the differential amplifier 52 to rise. This acts in the manner described, to increase the conductivity of transistor 68. Collector 75 of transistor 68 is connected to the base of transistor 70, and causes transistor 70 to conduct through diode 72 and "steal" current applied from the source 43 to the base of transistor 46. Thus the current control takes over from the voltage control. This reduces the output current of power stage 26 which is applied through output terminal 32 to the injector coils 10. This reduction in current through the coils occurs at a point in time after the magnetic field of the injector coils 10 has built up to open the injector valves at a specific time. The reduced current, illustrated by the part of FIG. 2 indicated as B, is sufficient to maintain the valves in the open position, since the magnetic field from the coils to hold the valves open requires less current than that required to open up the valves.

As previously stated, the voltage on the supply line 38 may drop to a very low voltage, such as 6 volts, under certain conditions, as when the internal combustion engine is being cranked. In order to insure that sufficient current is applied to the coils under such conditions, a low voltage compensating circuit is provided. This includes a terminal 80 adapted to be connected to a regulated voltage, to which a voltage divider string is connected including resistor 81, zener diode 82 and resistor 83. This string is normally conducting to provide a voltage across resistor 83 which holds transistor 85 conducting, and this brings the base of transistor 86 near ground, so that this transistor is cut off. Transistor 86 is connected in series with resistor 88 across the transistor 65. When the voltage at point 80 drops to a low value, as for example 6 volts, the zener diode 82, which may be selected to conduct at 7 volts, is rendered nonconducting so that the voltage divider is open circuited and transistor 85 is turned off. The voltage from terminal 80 is therefore applied through resistor 87 to the base of transistor 86, and renders transistor 86 conducting. This pulls current through resistor 88 and reference resistor 77, to drop the voltage applied to input terminal 78 of the differential amplifier. This voltage which is applied to the base of transistor 62 causes the differential amplifier 52 to act through transistors 68 and 70 to increase the current supplied to the injector coils 10. When the supply voltage rises to its normal value, in the range from 11 to 16 volts, the zener diode 82 will again conduct so that the low voltage compensating circuit is rendered inactive.

Figure 3:
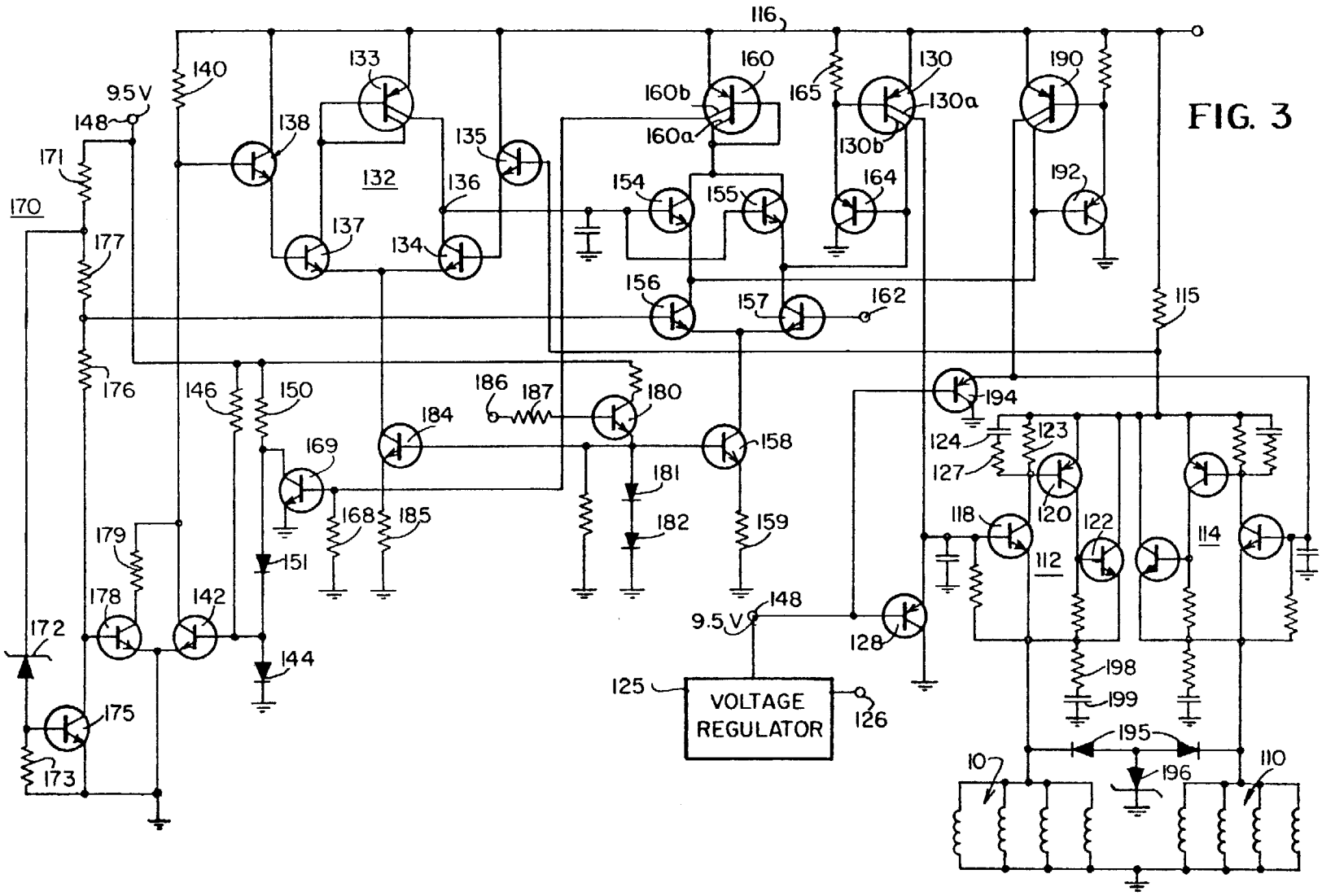
FIG. 3 is a schematic diagram of a second embodiment of the invention.

In FIG. 3 there is illustrated a second embodiment of the invention which includes a power amplifier for supplying current to injector coils for an internal combustion engine, which is controlled by a regulator which provides constant voltage across the coils during the initial part of the cycle, and constant current through the coils during the final part of the cycle. In FIG. 3, two sets of injector coils are provided, set 10 as in FIG. 1, and a second set 110. As previously stated, each set includes four coils for the injector valves which provides fuel to half of the eight cylinders of a V-8 engine. The four coils in the set 10 are energized simultaneously during one 180° portion of rotation of the engine and the coils of set 110 are energized during the other 180° portion. Separate power amplifiers are provided for supplying the current to the two sets of coils, with amplifier 112 supplying current to the coils 10, and amplifier 114 supplying current to the coils 110. The currents for both amplifiers are drawn through resistor 115 which is connected to the voltage supply line 116.

The power amplifiers 112 and 114 are generally similar to the amplifier stage 26 in the circuit of FIG. 1. The amplifier 112 includes NPN transistor 118 which drives PNP transistor 120, which in turn drives the final NPN transistor 122. All three transistors contribute to the current supplied to the coils 10, with the transistor 122 supplying the largest portion of the current. Resistor 123 and the series combination of capacitor 124 and resistor 127, connected between the base and emitter of transistor 120, act to prevent spurious oscillations in the power amplifier 112. The power amplifier 114 can be identical to the power amplifier 112.

A voltage regulator 125 is provided for controlling the power amplifier to provide a constant voltage over the first part of the cycle. The voltage regulator 125 may be of known construction and can provide a regulated output voltage of about 9.5 volts from the voltage supplied applied at terminal 126. This voltage may be from a battery having a nominal voltage of 12 volts, and which varies from about 11 to 16 volts under various conditions of charge. The regulated voltage is applied to the base of PNP transistor 128, the emitter of which is connected to one collector of transistor 130, and the collector of which may be connected to ground. Transistor 130 is a multiple collector lateral transistor, with collector 130a being of a size to provide three times as much current as collector 130b. The transistor 130 is normally conducting to complete a path through collector 130a for transistor 128. The voltage at the emitter of transistor 128 is above the reference voltage applied to the base thereof by the base-emitter drop of transistor 128. With the reference voltage being at 9.5 volts, a voltage of approximately 10.2 volts is applied to the base of input transistor 118 of amplifier 112. The voltage at the emitter of transistor 118, which is applied to the coils 10, is reduced by the base-emitter drop to about 9.5 volts, and is therefore substantially the same as the reference voltage.

In the event that the voltage across the injector coils 10 rises above the reference voltage, transistor 118 will start to be biased off to reduce the conductivity of transistor 120, which will in turn reduce the conductivity of transistor 122. This will reduce the current flow in the coils 10, and thereby reduce the voltage across the injector coils. Sufficient current is applied to the base of transistor 118 by transistor 130 so that the required current is applied to the injector coils 10. The voltage regulator action then starts, as has been described, to hold the voltage across the coils constant.

As in the system of FIG. 1, the current regulating circuit comes in effect when the voltage across resistor 115 reaches a predetermined value. Resistor 115 is in the circuit for both power amplifiers 112 and 114, but only one of these amplifiers will be operative at any given time. Accordingly, the current through resistor 115 will be only the current supplied to the bank of regulator coils 10, or the bank of regulator coils 110. As described in connection with the circuit of FIG. 1, the system will automatically cross over from the constant voltage condition to the constant current condition when the current through resistor 115 reaches five amperes. This will provide a voltage of one half volt cross the 0.1 ohm resistor 115.

The current control circuit includes differential amplifier 132 formed by two Darlington connected transistor pairs, the first including transistor 134 and 135, and the second including transistors 137 and 138. The voltage across resistor 115 is applied to the base of transistor 135, and a reference voltage is applied to the base of transistor 138. The differential amplifier 132 includes a current source formed by transistor 184 and resistor 185, and is similar to the differential amplifier 52 in the circuit of FIG. 1.

The reference voltage applied to the base of transistor 138 is produced across resistor 140 which is connected to the voltage supply line, and in series with transistor 142 to ground. The current through resistor 140 is regulated by the conduction of transistor 142, which is in turn controlled by the conductivity of diode 144 connected between the base of transistor 142 and the emitter thereof. Connected in series between the regulated voltage applied to terminal 148 and diode 144 is a first path including resistor 146 and a second path including resistor 150 and diode 151. The regulated voltage at terminal 148 may be provided by the voltage regulator 125. The sum of the currents through resistors 146 and 150 flows through diode 144, and the characteristics of this diode and transistor 142 are matched so that substantially the same value of current which flows through diode 144 will also flow through the emitter-collector path of transistor 142. Accordingly, the current through diode 144 will also flow through the reference resistor 140. It will be apparent that the current relation does not need to be that described as the components can be constructed to provide a ratio of currents other than a unity ratio.

While the current is building up through the injector coils 10, the reference voltage applied to the base of transistor 138 causes transistors 134 and 135 of the differential amplifier 132 to be conducting and transistors 137 and 138 to be nonconducting. When the voltage across resistor 115 reaches the desired level, such as that produced by 5 amps, the conduction of transistors 134 and 135 will decrease and the conduction of transistors 137 and 138 will increase. Connected to the transistors 134 and 137 is a turn around circuit including the multiple collector transistor 133 which provides the same action as transistor 22 and diode 20 in the differential amplifier 14 of FIG. 1. The output point 136 of the differential amplifier 132 is at the connection between the collector of transistor 134 and one of the collectors of transistor 133. The point 136 is connected to the base electrodes of transistors 154 and 155 which are individually connected with transistors 156 and 157 in separate branches of a differentially operating circuit. The common emitters of transistors 156 and 157 are connected through transistor 158 and resistor 159 to the reference potential, and the common collectors of transistors 154 and 155 are connected through one collector of multiple collector transistor 160 to the voltage supply line 116.

This differential circuit is operated by a voltage applied to terminal 162 connected to the base electrode of transistor 157 to render this transistor conducting during 180° of the rotation of the engine and nonconducting during the other 180°. A reference potential is applied to the base electrode of transistor 156, as will be described, to provide the differential action so that when transistor 157 is conducting, transistor 156 is cut off, and when transistor 157 is cut off, transistor 156 is conducting. In the following description it is assumed that transistor 157 is conducting so that transistor 155 is operative. Transistor 158 is rendered conducting by switch transistor 180 which causes current flow through diodes 181 and 182. The drop across the diodes 181 and 182 renders transistor 158 conducting and provides a voltage equal to one diode drop across resistor 159. Assuming that the switch transistor 180 is conducting, and that transistor 158 is thereby conducting, current having a value of about 1 mil will flow through the resistor 159 and through transistor 157 (or transistor 156). A path for this current is normally provided through the collector electrode 130b of transistor 130.

When transistors 134 and 135 of differential amplifier 132 reduce conduction as the current through resistor 115 increases, transistor 155 will be rendered conducting so that the current through resistor 159 will be diverted from transistor 130 to transistor 155. Transistor 164 is connected to control transistor 130, with the emitter of transistor 164 connected to the base of transistor 130, and the base of transistor 164 connected to the collector 130b of transistor 130. When current flows through the collector [139b] *130b* of transistor 130, current will also flow in parallel through the base and emitter of transistor 164. When this current reduces, the voltage drop across resistor 165 will likewise reduce to cause the voltage at the base of transistor 130 to rise to reduce the current flow therethrough. As previously stated, the current through collector 130a is three times that through collector 130b. The reduction in current at collector 130a is amplified by the power amplifier 112 to greatly reduce the current applied to the coils 10.

Transistor 160 which has one collector 160a thereof connected to the collectors of transistors 154 and 155 has a second collector 160b, and is constructed so that the current through 160b is about three times that through collector 160a. When transistors 154 and 155 are turned on by the differential amplifier 132, this will cause the transistor 160 to conduct so that current from collector 160b will provide a voltage across resistor 168 to render transistor 169 conducting. Transistor 169 shunts the current through resistor 150 so that it does not flow through the diode 144. The current through resistor 150 is about twice the current through resistor 146, so that this shunting action reduces the current through diode 144 to about one-third its prior value. This controls the reference voltage across resistor 140 so that it reduces to about one-third its prior value, so that the voltage applied to the base of transistor 138 is reduced to about one-third.

The differential amplifier will act as described above to reduce the current supplied to the amplifier 112 so that the current through resistor 115 is only about one-third of its prior value. When the system is set up so that the current regulator switches in when the current through resistor 115 is about 5 amps, the current provided after the current regulator is operating will drop to about 1.6 amps. This operation is shown by FIG. 2, and is generally the same as previously described.

A low voltage sensing circuit 170 is coupled to transistor 142 in the voltage reference circuit, which may be generally the same as the low voltage sensing circuit described in connection with FIG. 1. This includes resistor 171 connected in series with zener diode 172 and resistor 173 between terminal 148 and the ground potential. Resistor 173 provides a bias to transistor 175 to normally hold the same conducting, with the collector of transistor 175 being connected by resistors 176 and 177 to resistor 171. The junction between resistors 176 and 177 provides the reference voltage to the base of transistor 156 to control the differential action, as previously described. Transistor 178 is connected in series with resistor 179 across transistor 142 to provide additional current through resistor 140 when transistor 175 is rendered nonconducting. This further drops the reference voltage applied to the base of transistor 138 so that adequate current is insured in the injector coils when the supply voltage drops to a very low value, as has been previously described.

As has been stated, the transistors 156 and 157 are alternately conducting, each during one 180° period of rotation of the engine with which the fuel injector system is utilized. The transistor 158 connected in series with transistors 156 and 157 is rendered conducting by a switch circuit including transistor 180, which provides a voltage drop across diodes 181 and 182. Transistor 184, which is in the emitter circuit of differential amplifier circuit 132, is also rendered conductive by the switch transistor 180. When transistor 158 is not conducting, there is no current path to the base of transistor 164 and this transistor is nonconducting so that the voltage across resistor 165 renders transistor 130 nonconducting. This in turn cuts off transistor 128 so that there is no drive for the amplifier 112, and no current flows through the injector coils 10.

A positive turn on potential is applied to terminal 186 and coupled through resistor 187 to the base of transistor 180. This voltage is greater than the base-to-emitter drop of transistor 180 and the drops across diodes 181 and 182 to cause turn on of transistor 180. The voltage across diodes 181 and 182 causes the turn on of transistor 158 and 184 so that drive is applied to power amplifier 112. This causes current to flow through coils 10, as shown by the rising part of the curve in FIG. 2, indicated as A. As previously stated, this current continues to rise as the voltage is maintained across the injector coils until the combined current through the four coils reaches a value of about 5 amps.

Since transistor 184 is also turned on by the switch transistor 180, differential amplifier 132 is operative to provide control action when the current through resistor 115 reaches the 5 ampere level. This action, which was previously described, acts to cut down the output current to a value of about 1.6 amps, as shown by B in FIG. 2. The output current continues at this low level until switch transistor 180 is turned off, when the current in the coils terminates as shown at point C in FIG. 2. The reduced current through the coils is adequate to retain the injector valves open, and the use of reduced current makes it possible to turn off the current and allow the valves to close more precisely at the desired time.

When the signal applied to terminal 162 changes at the 180° rotation points of the engine to cut off transistor 157 and turn on transistor 156, the action of the differential amplifier 132 will transfer from transistor 155 to transistor 154, and will effect the operation of the transistors 190 and 192. The transistor 190 is of the same construction, and operates in the same manner, which has been described for transistor 130, and cooperates with transistor 194 to control the second power amplifier 114. Transistor 192 acts in the manner described for transistor 164 to control the action of transistor 190. Power amplifier 114 acts to provide current through the bank of injector coils 110, in the same manner that amplifier 112 controls the current in the injector coils of bank 10. The switch transistor 180 is turned on for a portion of the time during which each transistor 156 or 157 is enabled, to control amplifier 112 or amplifier 114.

Each of the banks of injector coils is coupled through a diode 195 to zener diode 196, so that the energy in the coils when the current is turned off is dissipated in the zener diode. For preventing parasitic oscillations when current is applied to and terminated in the injector coils, a circuit including resistor 198 and capacitor 199 is connected across each of the banks of coils.

The circuit of the invention has been found to be highly effective in controlling the operation of the coils of injector valves, to thereby precisely control the opening and closing of the valves and in turn control the amount of fuel fed to the cylinders of the engine. Substantially all of the components of the control circuit can be formed as an integrated circuit to provide a compact inexpensive unit.

We claim:

[1. A circuit for supplying current from a power supply to an inductive load, including in combination:

power stage means coupled to the power supply and having an input terminal and an output terminal adapted to be connected to the inductive load to supply current thereto, said power stage means having output current sensing means;

voltage regulator means coupled to said input terminal for controlling said power stage means to maintain a substantially constant voltage at said output terminal thereof; and current regulator means including a current regulator circuit having an input and an output, means coupling said input of said current regulator circuit to said output current sensing means, and circuit means coupling said output of said current regulator circuit to said input terminal for controlling the current supplied by said power stage to the inductive load, said current regulator circuit being rendered operative to control the output current in response to a voltage across said output current sensing means which indicates that the current in the load has reached a predetermined value.]

[2. A circuit in accordance with claim 1 wherein said voltage regulator means includes a differential amplifier having a first input coupled to said output terminal of said power stage means, a second input, and an output, reference voltage means providing a substantially fixed voltage connected to said second input of said differential amplifier, and control means coupling said output of said differential amplifier to said input terminal of said power stage means to control the operation of said power stage means so that the voltage at said output terminal remains substantially constant.]

[3. A circuit in accordance with claim 2 wherein said differential amplifier and said control means cooperate to control said power stage means so that the voltage at said output terminal thereof is substantially the same as the reference voltage applied to said second terminal of said differential amplifier.]

[4. A circuit in accordance with claim 3 wherein said control means includes an emitter-follower circuit.]

[5. A circuit in accordance with claim 1 wherein said voltage regulator means includes control means connected to said input terminal of said power stage means for applying current thereto for controlling the voltage at said output terminal thereof, and said circuit means of said current regulator means is coupled to said input terminal for controlling the current applied by said control means to said input terminal of said power stage.]

[6. A circuit in accordance with claim 1 wherein said current regulator circuit includes, a differential amplifier having first and second inputs and an output, said first input of said differential amplifier forming said input of said current regulator circuit and said output of said differential amplifier forming said output of said current regulator circuit, reference voltage means connected to said second input of said differential amplifier; and means coupling said circuit means to said reference voltage means for changing the reference voltage applied to said second input of said differential amplifier in response to a signal in said circuit means produced in response to the voltage across said output current sensing means, to control said power stage to reduce said output current to a value less than said predetermined value.]

[7. A circuit of claim 6 wherein said reference voltage means includes means having first and second branches with substantially fixed current therein, and means for providing a reference voltage which is related to the value of the currents in said first and second branches.]

[8. A circuit in accordance with claim 7 wherein said reference voltage means includes means for shunting said first branch so that the reference voltage is related to the value of the current in said branch alone.]

[9. A circuit in accordance with claim 6 wherein said reference voltage means includes means responsive to decrease in the voltage of the power supply means to modify the voltage applied to said second input of said differential amplifier to modify the action thereof to cause said power stage to apply increased current to the load.]

10. A circuit for [supply] *supplying* current from a power supply to first and second banks of coils of injector valves, including in combination:

power stage means including first and second sections coupled to the power supply and each having an input terminal and an output terminal adapted to be connected to one bank of coils to supply current thereto, said power stage means having output current sensing means common to said first and second sections;

voltage regulator means adapted to provide a substantially constant voltage;

current regulator means having an input and an output, means coupling said input of said current regulator means to said output current sensing means; and circuit means including first and second sections each coupled to said input terminal of one of said sections of said power stage means, said circuit means being coupled to said voltage regulator means and responsive to the voltage provided thereby to provide a substantially constant voltage at said output terminals of said sections of said power stage means, said circuit means being coupled to said output of said current regulator means and controlling said sections of said power stage means so that the current supplied thereby to the bank of coils connected thereto is maintained substantially constant;

said current regulator means being rendered operative to control said sections of said power stage means in response to a voltage across said output current sensing means which indicates that the current in the coils has reached a predetermined value.

11. A circuit in accordance with claim 10 further including switch means coupled to said circuit means for selectively rendering said first and second sections thereof operative to control said sections of said power stage means coupled thereto.

12. A circuit in accordance with claim 11 wherein said switch means includes means for actuating the operative sections of said circuit means to control the section of said power stage means connected thereto to initiate the supply of current to the associated bank of coils and to terminate such current supply.

13. A circuit in accordance with claim 10 wherein said current regulator means includes, a differential amplifier having first and second inputs and an output, with said first input of said differential amplifier forming said input of said current regulator means and said output of said differential amplifier forming said output of said current regulator means, reference voltage means connected to said second input of said differential amplifier, said differential amplifier being rendered operative when the voltage applied to said first input thereof from said output current sensing means has a value equal to the voltage applied to said second input of said differential amplifier to control said circuit means and cause said sections of said power stage means to supply substantially constant current to the associated bank of coils.

14. A circuit in accordance with claim 13 wherein said reference voltage means is coupled to said output of said differential amplifier and includes means for changing the voltage applied to said second input of said differential amplifier so that said current regulator means controls said power stage means so that the current supplied to the coils is maintained at a substantially constant value below said predetermined value.

[15. A circuit in accordance with claim 10 wherein each of said sections of said circuit means includes first, second and third transistors, with said first transistor having base, emitter and first and second collector electrodes, and said second and third transistors each having base, emitter and collector electrodes, means connecting the path between said emitter and said first collector of said first transistor in series with the path between said emitter and said collector of said second transistor across the power supply, and connecting the junction between said first collector and said emitter of said second transistor to said input of the section of said power stage means connected to such section of said circuit means, resistor means connected in series with the path between said emitter and said collector of said third transistor across the power supply, the junction between said resistor and said emitter of said third transistor being connected to said base of said first transistor, and means connecting said second collector of said first transistor to said base of said third transistor and for controlling the current therein so that the conductivity of said first transistor is controlled to thereby control the current applied to said input of said connected section of said power stage means.]

*16. An integrated circuit for controlling the supply of current from a power supply to a load, the integrated circuit being adapted to control a power stage, the power stage having a power input terminal for being coupled to the power supply, a control terminal and an output terminal, the output terminal of the power stage being adapted to be connected to the load to supply current thereto, the integrated circuit including in combination:*

*first and second power supply conductors;*

*voltage regulator means for controlling the power stage to maintain a substantially constant voltage at the output terminal thereof during a voltage regulation operating mode;*

*first circuit means for coupling said voltage regulator means to said power stage control terminal, said first circuit means being directly connected between said power stage control terminal and said second power supply conductor;*

*means adapted to supply a signal representative of the magnitude of the load current;*

*current regulator means having input, output and control terminals, said control terminal of said current regulator means being connected to said means for applying said signal representative of the magnitude of the load current;*

*second circuit means coupling said output terminal of said current regulator means to said power stage control terminal for controlling the current supplied by the power stage to the load, said second circuit means being directly connected between said power stage control terminal and said second power supply conductor so that said second circuit means includes a current path in parallel with said first circuit means; and*

*current source means coupled to said power stage control terminal for energizing said first and second circuit means to enable regulation of the load current and voltage.*

*17. The integrated circuit of claim 16 wherein said first circuit means includes an emitter follower transistor having a collector electrode directly connected to said second power supply conductor, a base electrode coupled to said output terminal of said voltage regulator means, and an emitter electrode coupled to said power stage control terminal.*

*18. The integrated circuit of claim 16 wherein said current regulator means includes a differential amplifier utilizing two Darlington connected pairs of transistors of the same conductivity type having collector electrodes coupled to said first power supply conductor and emitter electrodes coupled to said second power supply conductor.*

*19. The integrated circuit of claim 18 wherein:*

*said first power supply conductor is adapted to receive a first potential;*

*said second power supply conductor is adapted to receive a potential which is negative with respect to said first potential; and*

*said Darlington connected pairs of transistors are of the NPN conductivity type.*

*20. The integrated circuit of claim 18 further including a further current source having a transistor of another conductivity type connected between the collector electrodes of one of said transistors of each of said Darlington connected pairs of transistors.*

*21. The integrated circuit of claim 16 wherein said second circuit means includes an additional current source.*

*22. The integrated circuit of claim 21 wherein said additional current source includes input, output and control terminals, said additional current source being responsive to control signals at said control terminal thereof to control the magnitude of the output current thereof.*

*23. The integrated circuit of claim 22 wherein said additional current source includes in combination:*

*first transistor means having an emitter electrode for providing said input terminal, a base electrode, a first collector electrode, and a second collector electrode for providing said output terminal; and*

*second transistor means having an emitter electrode connected to said base electrode of said first transistor means, and a base electrode connected to said first collector electrode of said first transistor means for providing said control terminal of said current source.*

*24. A circuit for controlling the energy flowing through first and second power stages for respectively driving first and second electrical loads which are to be energized during different time intervals, each of the power stages having a control terminal, the circuit including in combination:*

*first differentially connected transistor and second differentially connected transistor having emitter electrodes connected together, base electrodes, and collector electrodes;*

*first circuit means for coupling said collector electrode of said first differentially connected transistor to the control terminal of the first power stage;*

*second circuit means for coupling said collector electrode of said second differentially connected transistor to the control terminal of the second power stage;*

*controllable constant current source means connected to said emitter electrodes of said first and second differentially connected transistors, said controllable constant current source means selectively determining whether both of said differentially connected transistors can be rendered conductive by control signals applied to said base electrodes thereof*

*said first circuit means including a first controllable variable current supply means having a control terminal connected to said collector electrode of said first differentially connected transistor and an output electrode connected to said control terminal of the first power stage;*

*said second circuit means including a second controllable variable current supply means having a control terminal connected to said collector electrode of said second differentially connected transistor and an output electrode connected to said control terminal of the second power stage; and*

*said first controllable variable current supply means being responsive to said first differentially connected transistor being rendered conductive to cause the first power stage to energize the first load and said second controllable variable current supply means being responsive to said second differentially connected transistor being rendered conductive to cause the second power stage to energize the second load.*

*25. The circuit of claim 24 further including in combination:*

*current regulator means having an output electrode connected to said control terminal of said first controllable variable current supply means and to said control terminal of said second variable controllable current supply means, said current regulator means being operative to enable whichever of said first and second variable controllable current supply means is operative to provide control signals which cause the power stage connected thereto to provide regulated currents to an electrical load.*

*26. The circuit of claim 24 further including in combination:*

*voltage regulating means having an output terminal, means coupling said output terminal of said voltage regulating means to the control terminals of the first and second power stages, said voltage regulating means being responsive to the output current of whichever of said first and second controllable variable current supply means is operative to enable the corresponding power stage to develop a regulated voltage across the electrical load associated therewith during a voltage regulation mode of operation.*

*27. The circuit of claim 26 wherein said means coupling the output terminal of the voltage regulating means to the control terminals of the power stages includes an emitter follower transistor having a base electrode connected to said output terminal of said voltage regulator means, a collector electrode connected to receive a reference poten-*

*tial, and an emitter electrode connected to the control terminals of the first and second power stages.*

*28. A circuit for controlling the energy flowing through first and second power stages for respectively driving first and second electrical loads which are to be energized during different time intervals, each of the power stages having a control terminal, the circuit including in combination:*

*first differentially connected transistor and second differentially connected transistor having emitter electrodes connected together, base electrodes, and collector electrodes;*

*first circuit means coupling said collector electrode of said first differentially connected transistor to the control terminal of the first power stage, said first circuit means including a first controllable variable current supply means having a control terminal connected to said collector electrode of said first differentially connected transistor and an output electrode connected to said control terminal of the first power stage, said first controllable variable current supply means being responsive to said first differentially connected transistor being rendered conductive to cause the first power stage to energize the first load;*

*second circuit means for coupling said collector electrode of said second differentially connected transistor to the control terminal of the second power stage, said second circuit means including a second controllable variable current supply means having a control terminal connected to said collector electrode of said second differentially connected transistor and an output electrode connected to said control terminal of the second power stage, said second controllable variable current supply means being responsive to said second differentially connected transistor being rendered conductive to cause the second power stage to energize the second load;*

*each of said controllable variable current supply means including in combination first transistor means having an emitter electrode, a base electrode, a first collector electrode, and a second collector electrode for providing said output terminal; and second transistor means having an emitter electrode connected to said base electrode of said first transistor means, and a base electrode connected to said first collector electrode of said first transistor means for providing said control terminal of said controllable variable current supply means; and*

*controllable constant current source means connected to said emitter electrodes of said first and second differentially connected transistors, said controllable constant current source means determining whether both of said differentially connected transistors can be rendered conductive by control signals applied to said base electrode thereof.*

*29. A circuit for supplying current from a power supply to first and second banks of coils of injector valves, including in combination:*

*power stage means including first and second sections coupled to the power supply and each having an input terminal and an output terminal adapted to be connected to one bank of coils to supply current thereto, said power stage means having output current sensing means common to said first and second sections;*

*voltage regulator means adapted to provide a substantially constant voltage;*

*current regulator means having an input and an output, means coupling said input of said current regulator means to said output current sensing means; and*

*circuit means including first and second sections each coupled to said input terminal of one of said sections of said power stage means, said circuit means being coupled to said voltage regulator means and responsive to the voltage provided thereby to provide a substantially constant voltage at said output terminals of said sections of said power stage means, said circuit means being coupled to said output of said current regulator means and controlling said sections of said power stage means so that the current supplied thereby to the bank of coils connected thereto is maintained substantially constant;*

*current source means coupled to said power stage means for energizing said circuit means to enable regulation of the current and voltage of said first and second banks of coils of injector valves; and*

*said current regulator means being rendered operative to control said sections of said power stage means in response to a voltage across said output current sensing means which indicates that the current in the coils has reached a predetermined value.*

*30. A circuit for supplying current from a power supply to an inductive load, including in combination:*

*power stage means coupled to the power supply and having an input terminal and an output terminal adapted to be connected to the inductive load to supply current thereto, said power stage means having output current sensing means:*

*voltage regulator means coupled to said input terminal for controlling said power stage means to maintain a substantially constant voltage at said output terminal thereof;*

*current regulator means including a current regulator circuit having an input and an output, means coupling said input of said current regulator circuit to said output current sensing means;*

*circuit means coupling said output of said current regulator circuit to said input terminal of said power stage means for controlling the current supplied by said power stage to the inductive load, said current regulator circuit being rendered operative to control the output current in response to a voltage across said output current sensing means which indicates that the current in the load has reached a predetermined value;*

*said current regulator circuit further including a differential amplifier having first and second inputs and an output, said first input of said differential amplifier forming said input of said current regulator circuit and said output of said differential amplifier forming said output of said current regulator circuit;*

*reference voltage means connected to said second input of said differential amplifier, said reference voltage means including means having first and second branches with substantially fixed current therein, and means for providing a reference voltage which is related to the value of the currents in said first and second branches, said reference voltage means further including means for shunting said first branch so that the reference voltage is related to the value of the current in said second branch alone; and*

*means coupling said circuit means to said reference voltage means for changing and reference voltage applied to said second input of said differential amplifier in response to a signal in said circuit means produced in response to the voltage across said output current sensing means, to control said power stage to*

*reduce said output current to a value less than said predetermined value.*

*31. A circuit for supplying current for a power supply to both of first and second banks of coils of injector valves, including in combination:*

*power stage means including first and second sections coupled to the power supply and each having an input terminal and an output terminal adapted to be connected to one bank of coils to supply current thereto, said power stage means having output current sensing means common to said first and second sections;*

*voltage regulator means adapted to provide a substantially constant voltage;*

*current regulator means having an input and an output, means coupling said input of said current regulator means to said output current sensing means; and*

*circuit means including first and second sections each coupled to said input terminal of one of said sections of said power stage means, said circuit means being coupled to said voltage regulator means and responsive to the voltage provided thereby to provide a substantially constant voltage at said output terminals of said sections of said power stage means, said circuit means being coupled to said output of said current regulator means and controlling said sections of said power stage means so that the current supplied thereby to the bank of coils connected thereto is maintained substantially constant, each of said sections of said circuit means including first, second and third transistors, with said first transistors having base, emitter and first and second collector electrodes, and said second and third transistors each having base, emitter and collector electrodes, means connecting the path between said emitter and said first collector of said first transistor in series with the path between said emitter and said collector of said second transistor across the power supply, and connecting the junction between said first collector and said emitter of said second transistor to said input of the section of said power stage means connected to such section of said circuit means, resistor means connected in series with the path between said emitter and said collector of said third transistor across the power supply, the junction between said resistor and said emitter of said third transistor being connected to said base of said first transistor, and means connecting said second collector of said first transistor to said base of said third transistor and for controlling the current therein so that the conductivity of said first transistor is controlled to thereby control the current applied to said input of said connected section of said power stage means; and*

*said current regulator means being rendered operative to control said sections of said power stage means in response to a voltage across said output current sensing means which indicates that the current in the coils has reached a predetermined value.*

* * * * *